(12) United States Patent
Sato

(10) Patent No.: US 7,266,738 B2
(45) Date of Patent: Sep. 4, 2007

(54) TEST APPARATUS, PHASE ADJUSTING METHOD AND MEMORY CONTROLLER

(75) Inventor: Shinya Sato, Tokyo (JP)

(73) Assignee: Advantest Corporation, Tokyo (JP)

(*) Notice: Subject to any disclaimer, the term of this patent is extended or adjusted under 35 U.S.C. 154(b) by 251 days.

(21) Appl. No.: 11/180,895

(22) Filed: Jul. 13, 2005

(65) Prior Publication Data
US 2006/0041799 A1  Feb. 23, 2006

Related U.S. Application Data

(63) Continuation of application No. PCT/JP2005/005547, filed on Mar. 25, 2005.

(30) Foreign Application Priority Data
Apr. 5, 2004  (JP) ............................. 2004-111494

(51) Int. Cl.
*G11C 29/00* (2006.01)
(52) U.S. Cl. .................................... 714/718; 714/738
(58) Field of Classification Search ................ 714/736, 714/720, 36, 718, 738; 368/10; 324/532
See application file for complete search history.

(56) References Cited

U.S. PATENT DOCUMENTS

| | | | | |
|---|---|---|---|---|
| 5,659,553 A | * | 8/1997 | Suzuki | ........................ 714/736 |
| 5,732,047 A | * | 3/1998 | Niijima | ........................ 365/10 |
| 5,796,748 A | * | 8/1998 | Housako et al. | ............. 714/720 |
| 6,016,565 A | * | 1/2000 | Miura | ........................ 714/736 |
| 6,469,514 B2 | * | 10/2002 | Okayasu | ..................... 324/532 |
| 6,586,924 B1 | * | 7/2003 | Okayasu et al. | .......... 324/158.1 |

FOREIGN PATENT DOCUMENTS

| | | |
|---|---|---|
| JP | 2001-4712 | 1/2001 |
| JP | 2001-222897 | 8/2001 |
| JP | 2002-181899 | 6/2002 |
| JP | 2003-98235 | 4/2003 |

OTHER PUBLICATIONS

International Search Report for International Application No. PCT/JP2005/005547 mailed Jul. 19, 2005, 3 pages.

* cited by examiner

*Primary Examiner*—David Ton
(74) *Attorney, Agent, or Firm*—Osha Liang LLP

(57) ABSTRACT

An inventive test apparatus has a timing comparator for obtaining an output value of an output signal outputted from a memory-under-test with timing of a strobe signal, a logical comparator for comparing the output value obtained by the timing comparator with an expected value and for outputting a comparison result and a phase adjustment control circuit for adjusting the timing of the strobe signal based on the comparison result outputted from the logical comparator. The inventive test apparatus further includes a first variable delay circuit for delaying and supplying the strobe signal to the timing comparator and the phase adjustment control circuit sets the delay effected by the first variable delay circuit based on the comparison result outputted from the logical comparator.

14 Claims, 12 Drawing Sheets

TEST APPARATUS, PHASE ADJUSTING METHOD AND MEMORY CONTROLLER

The present application is a continuation application of PCT/JP2005/005547 filed on Mar. 25, 2005 which claims the priority in Japanese Patent Application No. 2004-111494 filed on Apr. 5, 2004 and whose content is incorporated in the present application by reference as part of description thereof.

BACKGROUND OF THE INVENTION

1. Field of the Invention

The present invention relates to a test apparatus, a phase adjusting method and a memory controller. More specifically, the present invention relates to a test apparatus for testing a memory-under-test, a phase adjusting method for adjusting timing of an output signal outputted from the memory-under-test and a strobe signal, and a memory controller for controlling writing/reading data to/from the memory.

2. Related Art

FIG. 12 shows a configuration of a conventional test apparatus 10. The test apparatus 10 is provided with variable delay circuits 12, 14, 22, 24, 32 and 42, SR latches 16 and 26, drivers 18 and 28, level comparators 30 and 40 and timing comparators 34 and 44.

The SR latch 16 generates and outputs a test pattern signal based on a set signal delayed by the variable delay circuit 12 and a reset signal delayed by the variable delay circuit 14 and supplies the signal to a memory-under-test 50 via the driver 18. The SR latch 26 generates and outputs a test pattern signal based on a set signal delayed by the variable delay circuit 22 and a reset signal delayed by the variable delay circuit 24 and supplies the signal to the memory-under-test 50 via the driver 28. The timing comparator 34 receives an output signal from the memory-under-test 50 via the level comparator 30 and samples an output value based on a strobe signal delayed by the variable delay circuit 32. The timing comparator 44 receives an output signal from the memory-under-test 50 via the level comparator 40 and samples an output value based on a strobe signal delayed by the variable delay circuit 42.

Then, a logical comparator compares the output values sampled by the timing comparators 34 and 44 with an expected value generated in advance. The test apparatus 10 judges acceptability of the memory-under-test 50 based on the comparison result of the logical comparator.

Before executing the test of the memory-under-test 50, the following phase adjustment is made in the test apparatus 10. At first, the delays of the variable delay circuits 12 and 14 are set so that phases of the test pattern signals outputted from the drivers 18 and 28 are phased at terminals of the memory-under-test 50. Still more, the delays of the variable delay circuits 32 and 42 are set so that the output signals outputted from the memory-under-test 50 in the same phase are accurately sampled by the timing comparators 34 and 44.

Since the applicant of the invention is unaware of existence of any document concerning to the prior art at the present time, description concerning to the prior art document will be omitted here.

In the phase adjustment in the conventional test apparatus 10, the delays of the variable delay circuits 12 and 14 are set so that the phases of the test pattern signals outputted from the drivers 18 and 28 are phased at the terminals of the memory-under-test 50. Therefore, in testing the memory-under-test 50 that operates at very high frequency, it becomes difficult to correctly sample the output signal outputted from the memory-under-test 50 due to dispersion of output timing of the output signal of the memory-under-test 50 and to dispersion of timing of the timing comparators 34 and 44 for receiving the strobe signals. Still more, it takes an enormous amount of time, thus dropping the throughput of the test, if the phase adjustment of the strobe signal is to be made every time when the memory-under-test 50 is mounted to suppress the dispersion of the timing of the timing comparators 34 and 44 for receiving the strobe signal.

SUMMARY OF THE INVENTION

Accordingly, it is an object of the invention to provide a test apparatus that is capable of solving the above-mentioned problems. This object may be achieved through the combination of features described in independent claims of the invention. Dependent claims thereof specify preferable embodiments of the invention.

That is, according to a first aspect of the invention, a test apparatus for testing a memory-under-test has a timing comparator for obtaining an output value of an output signal outputted from the memory-under-test with timing of a strobe signal, a logical comparator for comparing the output value obtained by the timing comparator with an expected value generated in advance and for outputting the comparison result and a phase adjustment control circuit for adjusting the timing of the strobe signal based on the comparison result outputted from the logical comparator.

The test apparatus may further include a first variable delay circuit for delaying the strobe signal and supplying the signal to the timing comparator and the phase adjustment control circuit may set the delay effected by the first variable delay circuit based on the comparison result outputted from the logical comparator.

The test apparatus may further include a fail counter for counting a number of fail data outputted from the logical comparator as the comparison result and indicating that the output value does not coincide with the expected value and a judging circuit for comparing the number of fail data counted by the fail counter with a judging value set in advance and outputting the judgment result, and the phase adjustment control circuit may set the delay effected by the first variable delay circuit based on the judgment result outputted from the judging circuit.

The phase adjustment control circuit may decide the delay effected by the first variable delay circuit and represented by binary data sequentially from the upper bit by binary search based on the judgment result outputted from the judging circuit.

The test apparatus may further include an SR latch for rising a test pattern signal with timing of a set signal and dropping the test pattern signal with timing of a reset signal and supplying the test pattern signal to the memory-under-test, a second variable delay circuit for delaying and supplying the set signal to the SR latch and a third variable delay circuit for delaying and supplying the reset signal to the SR latch, and the timing comparator may obtain the output value of the output signal outputted from the memory-under-test corresponding to the test pattern signal with timing of the strobe signal synchronized with internal clock of the memory-under-test, the logical comparator may compare the output value obtained by the timing comparator with the expected value and output the comparison result and the phase adjustment control circuit may set the delay effected by the second and third variable delay circuits based on the comparison result outputted from the logical comparator.

The test apparatus may further include a temperature detecting section for detecting changes of temperature of the memory-under-test or changes of temperature around the memory-under-test and a re-calibration control section for adjusting again the timing of the strobe signal when the temperature change detected by the temperature detecting section exceeds a temperature change set in advance.

The test apparatus may further include a re-calibration interval control section for measuring a time interval during which the timing of the strobe signal should be adjusted again based on the comparison result outputted from the logical comparator per elapsed time when data is written/read continuously to/from the memory-under-test.

According to a second aspect of the invention, a phase adjusting method for adjusting timing of an output signal outputted from a memory-under-test and a strobe signal has an output value obtaining step of obtaining an output value of the output signal outputted from the memory-under-test with timing of the strobe signal, a step of comparing the obtained output value with an expected value set in advance and of outputting the comparison result and a step of adjusting the timing of the strobe signal based on the comparison result.

The phase adjusting method may further include a slow writing step of writing a test pattern signal into the memory-under-test at low speed and a first fast reading step of reading the output signal corresponding to the test pattern signal from the memory-under-test at high speed, and the output value obtaining step may include a step of obtaining the output value of the output signal read in the first fast reading step with the timing of the strobe signal.

The slow writing step may include a step of writing the test pattern signal via scan input/output terminals of the memory-under-test and the first fast reading step may include a step of reading the test pattern signal out of data input/output terminals of the memory-under-test.

The phase adjusting method may further include a fast writing step of rising a test pattern signal with timing of a set signal, of dropping the test pattern signal with timing of a reset signal and writing the test pattern signal to the memory-under-test at high speed, a second fast reading step of reading the output signal corresponding to the test pattern signal out of the memory-under-test at high speed, a step of obtaining the output value of the output signal read out in the second fast reading step with the timing of the strobe signal, a step of comparing the obtained output value with the expected value set in advance and of outputting a comparison result and a step of adjusting the timing of the set and reset signals based on the comparison result.

The fast writing step may include a step of writing the test pattern signal from the data input/output terminals of the memory-under-test and the second fast reading step may include a step of reading the test pattern signal from the data input/output terminals of the memory-under-test.

According to a third aspect of the invention, a memory controller for controlling data writing and reading operations of a memory has a timing comparator for obtaining an output value of an output signal read out of the memory with timing of a strobe signal, a logical comparator for comparing the output value obtained by the timing comparator with an expected value set in advance and outputting the comparison result, a phase adjustment control circuit for adjusting the timing of the strobe signal based on the comparison result outputted from the logical comparator, a temperature detecting section for detecting changes of temperature of the memory or changes of temperature around the memory and a re-calibration control section for adjusting again the timing of the strobe signal when the temperature change detected by the temperature detecting section exceeds a temperature change set in advance.

According to a fourth aspect of the invention, a memory controller for controlling data writing and reading operations of a memory has a timing comparator for obtaining an output value of an output signal read out of the memory with timing of a strobe signal, a logical comparator for comparing the output value obtained by the timing comparator with an expected value set in advance and outputting the comparison result, a phase adjustment control circuit for adjusting the timing of the strobe signal based on the comparison result outputted from the logical comparator and a re-calibration interval control section for measuring a time interval during which the timing of the strobe signal should be adjusted again based on the comparison result outputted from the logical comparator per elapsed time when data is written or read continuously to/from the memory.

It is noted that the summary of the invention described above does not necessarily describe all necessary features of the invention. The invention may also be a sub-combination of the features described above.

The memory-under-test that transmits/receives data at high speed may be tested accurately by the inventive test apparatus.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
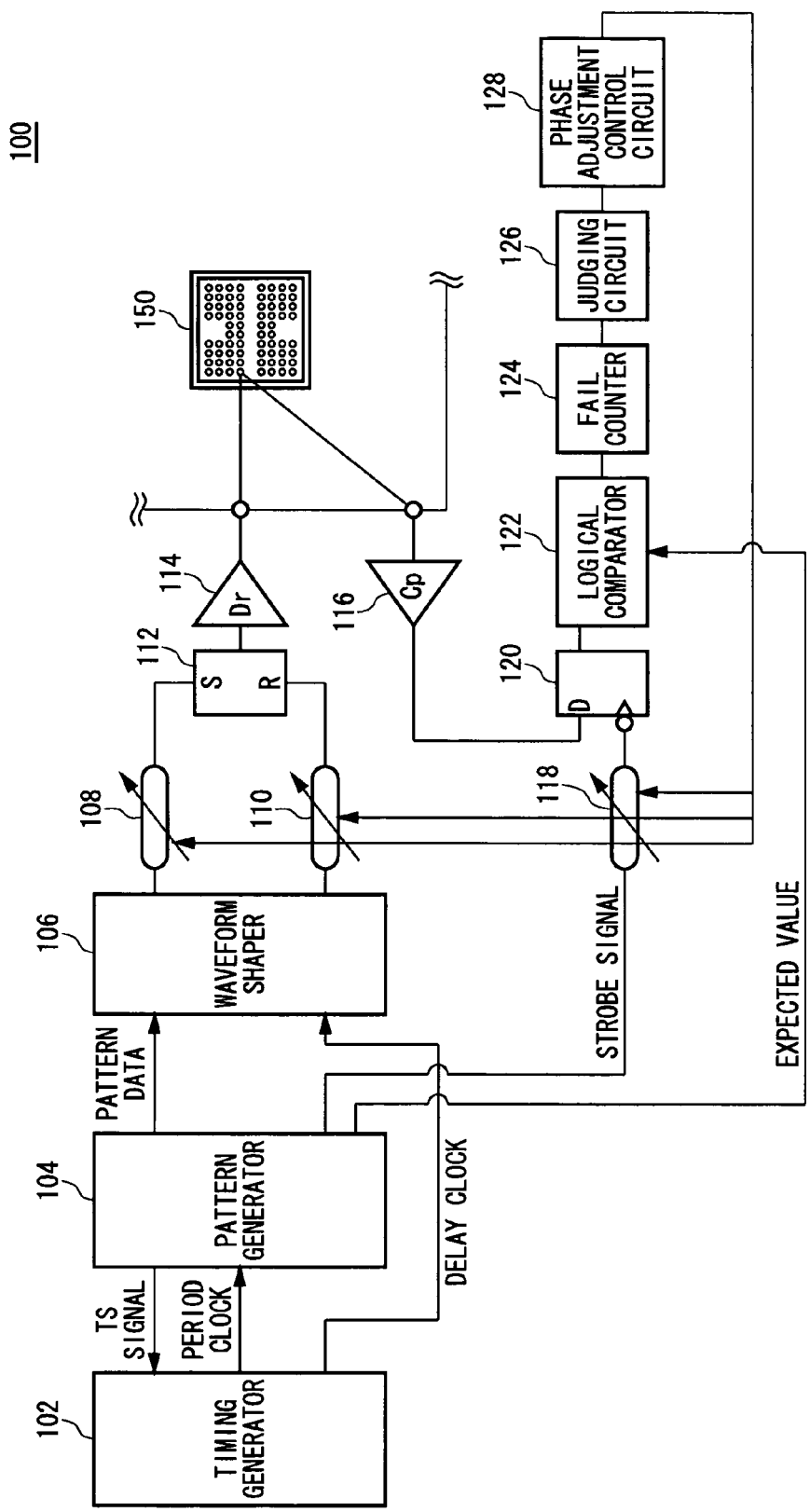
FIG. 1 is a diagram showing one exemplary configuration of a test apparatus 100.

FIG. 1 is a diagram showing one exemplary configuration of a test apparatus 100. The test apparatus 100 is provided with a timing generator 102, a pattern generator 104, a waveform shaper 106, a variable delay circuit 108, a variable delay circuit 110, an SR latch 112, a driver 114, a level comparator 116, a variable delay circuit 118, a timing comparator 120, a logical comparator 122, a fail counter 124, a judging circuit 126 and a phase adjustment control circuit 128.

The test apparatus 100 of the present embodiment aims at realizing high speed data transmission/receiving between the test apparatus 100 and a memory-under-test 150 by adjusting phase of a test data signal to be applied to the memory-under-test 150 and phase of a strobe signal for obtaining an output value of an output signal outputted from the memory-under-test 150 per terminal of the memory-under-test 150.

An operation of the test apparatus 100 for testing the memory-under-test 150 will be explained at first. The pattern generator 104 outputs a timing set signal (hereinafter referred to as 'TS signal') and supplies it to the timing generator 102. Based on timing data specified by the TS signal, the timing generator 102 generates period and delay clocks and supplies the delay clock to the pattern generator 104 and the delay clock to the waveform shaper 106. Then, based on the period clock supplied from the timing generator 102, the pattern generator 104 generates pattern data to be supplied to the memory-under-test 150 and supplies the data to the waveform shaper 106.

Based on the delay clock supplied from the timing generator 102, the waveform shaper 106 outputs set and reset signals in order to shape a test pattern signal specified by the pattern data generated by the pattern generator 104 into a waveform of required timing. The variable delay circuit 108 delays the set signal outputted from the waveform shaper 106 by a delay set in advance by the phase adjustment control circuit 128 and supplies the signal to the SR latch 112. Still more, the variable delay circuit 110 delays the reset signal outputted from the waveform shaper 106 by a delay set in advance by the phase adjustment control circuit 128 and supplies the signal to the SR latch 112. Then, the SR latch 112 rises the test pattern signal with the timing of the set signal supplied from the variable delay circuit 108 and drops the test pattern signal with the timing of the reset signal supplied from the variable delay circuit 110 and supplies the signal via the driver 114.

The pattern generator 104 also generates a strobe signal for specifying timing of the timing comparator 120 for sampling the output signal outputted from the memory-under-test 150. The variable delay circuit 118 delays the strobe signal generated by the pattern generator 104 by a delay set in advance by the phase adjustment control circuit 128 and supplies the signal to the timing comparator 120. The timing comparator 120 obtains an output value of the output signal of the memory-under-test 150 outputted from the memory-under-test 150 and converted into binary data by the level comparator 116 with the timing of the strobe signal supplied from the variable delay circuit 118.

Still more, the pattern generator 104 produces an expected value which is an output value of the output signal to be outputted from the memory-under-test 150 corresponding to the test pattern signal and supplies the value to the logical comparator 122. Then, the logical comparator 122 compares the output value obtained by the timing comparator 120 with the expected value produced in advance by the pattern generator 104 and outputs the comparison result. The acceptability of the memory-under-test 150 is judged based on the comparison result outputted from the logical comparator 122.

Next, an operation of the test apparatus 100 for adjusting phases of the test data signal and the strobe signal will be explained. Similarly to the testing operation described above, the timing comparator 120 obtains the output value of the output signal outputted from the memory-under-test 150 with the timing of the strobe signal supplied from the variable delay circuit 118. Then, the logical comparator 122 compares the output value obtained by the timing comparator 120 with the expected value and outputs the comparison result. In concrete, the logical comparator 122 outputs fail data when the output value coincides with the expected value and supplies the data to the fail counter 124. Then, the fail counter 124 counts a number of fail data outputted from the logical comparator 122 as the comparison result and indicating that the output value does not coincide with the expected value. The judging circuit 126 compares the number of fail data counted by the fail counter 124 with a judging value set in advance and outputs the judgment result. Based on the judgment result outputted from the judging circuit 126, the phase adjustment control circuit 128 sets the delay effected by the variable delay circuit 118. That is, the phase adjustment control circuit 128 adjusts the timing of the strobe signal supplied to the timing comparator 120 by setting the delay effected by the variable delay circuit 118 based on the comparison result outputted from the logical comparator 122. In concrete, the phase adjustment control circuit 128 sets a set value of a phase adjustment register of the variable delay circuit 118.

The timing comparator 120 also obtains the output value of the output signal outputted from the memory-under-test 150 corresponding to the test pattern signal with the timing of the strobe signal synchronized with an internal clock of the memory-under-test 150. Then, the logical comparator 122 compares the output value obtained by the timing comparator 120 with the expected value and outputs the comparison result. In concrete, the logical comparator 122 outputs fail data when the output value coincides with the expected value and supplies the data to the fail counter 124. Then, the fail counter 124 counts a number of fail data outputted from the logical comparator 122 as the comparison result and indicating that the output value does not coincide with the expected value. The judging circuit 126 compares the number of fail data counted by the fail counter 124 with a judging value set in advance and outputs the judgment result. Based on the judgment result outputted from the judging circuit 126, the phase adjustment control circuit 128 sets the delay effected by the variable delay circuits 108 and 110. That is, based on the comparison result outputted from the logical comparator 122, the phase adjustment control circuit 128 adjusts the timing of the set and reset signals to be supplied to the SR latch 112 by setting the delay effected by the variable delay circuits 108 and 110. In concrete, the phase adjustment control circuit 128 sets set values of the phase adjustment registers of the variable delay circuits 108 and 110.

As described above, the output value of the output signal outputted from the memory-under-test 150 maybe sampled accurately in the test stage by adjusting the phases of the strobe signal as well as the set and reset signals by utilizing the output signal actually outputted from the memory-under-test 150 in the phase adjusting stage. Accordingly, the memory-under-test 150 that transmits/receives data at high-speed may be accurately tested.

Figure 2:
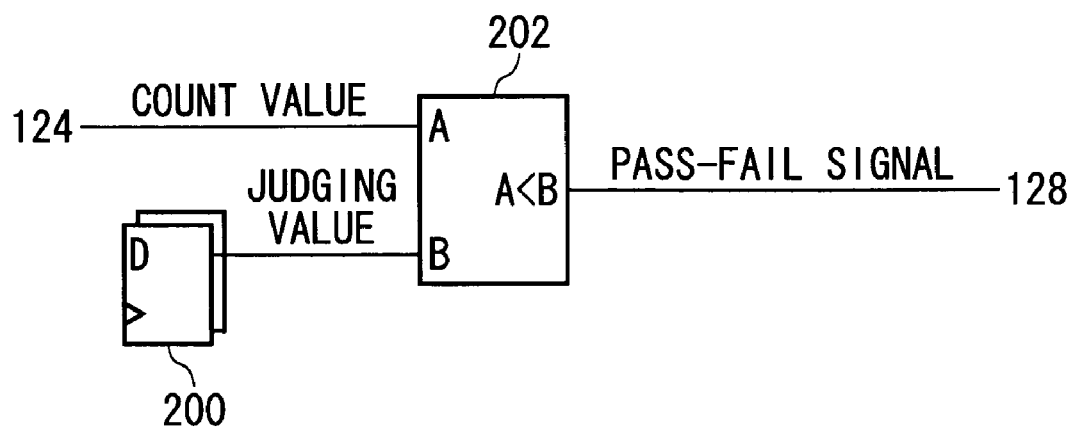
FIG. 2 is a diagram showing one exemplary configuration of a judging circuit 126.

FIG. 2 is a diagram showing one exemplary configuration of the judging circuit 126 of the first embodiment. The judging circuit 126 has a judging value register 200 and a count value comparator 202. The judging value register 200 stores judging values in advance and supplies the value to the count value comparator 202. The judging value is for example a half of a number of times of comparison carried out by the logical comparator 122 in the phase adjustment stage. The count value comparator 202 obtains the count value which is the number of fail data counted by the fail counter 124 from the fail counter 124 and compares whether it is larger or smaller than the judging value supplied from the judging value register 200. Then, the count value comparator 202 outputs a pass-fail signal as the judgment result and supplies the signal to the phase adjustment control circuit 128. For instance, the count value comparator 202 outputs "1" as pass data when the count value is smaller than the judging value and outputs "0" as fail data when the count value is larger than the judging value. It is noted that the count value comparator 202 may output "0" as fail data when the count value is smaller than the judging value and may output "1" as pass data when the count value is larger than the judging value.

Figure 3:
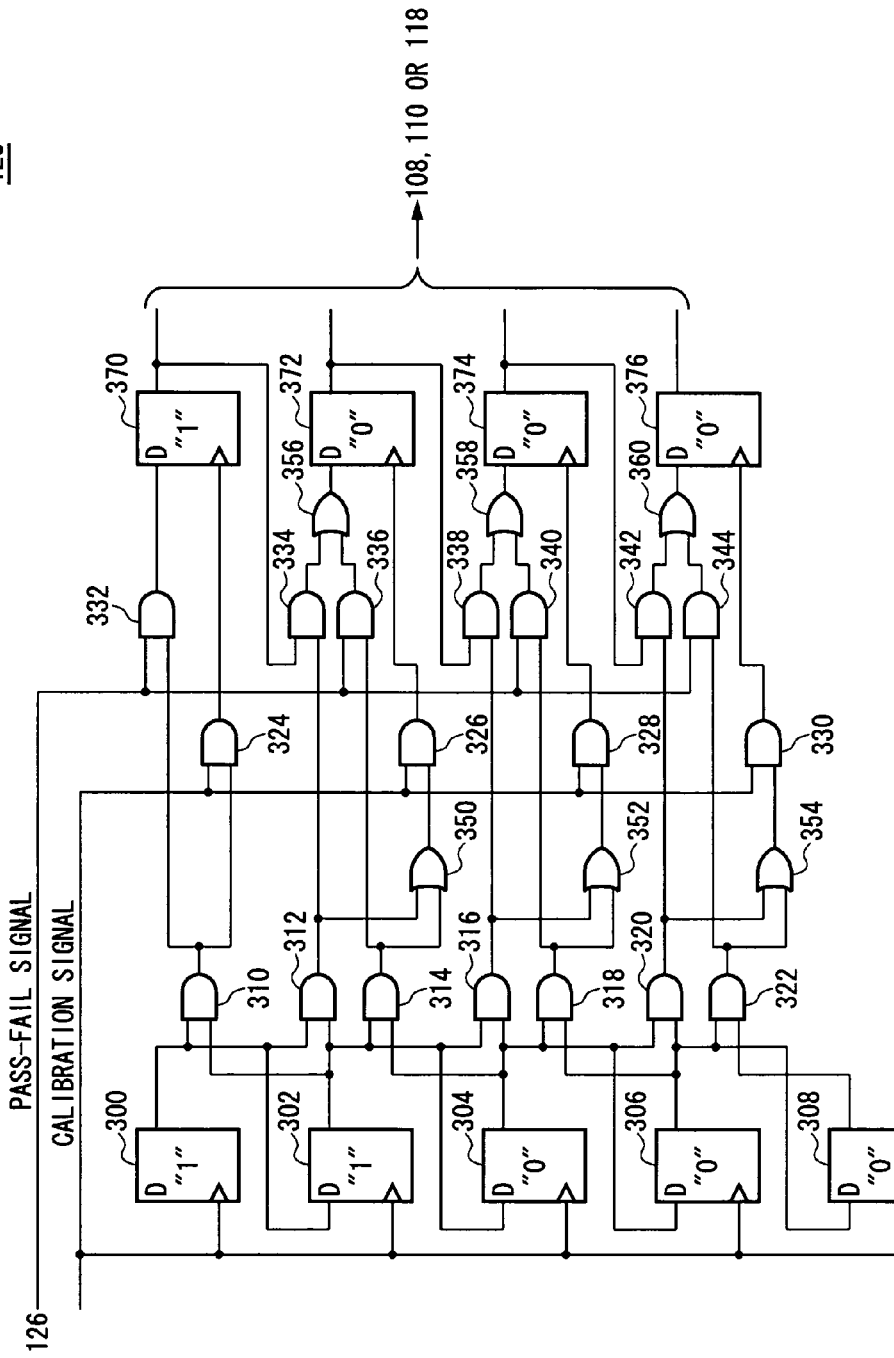
FIG. 3 is a diagram showing one exemplary configuration of a phase adjustment control circuit 128.

FIG. 3 shows one exemplary configuration of the phase adjustment control circuit 128. It is noted that a case when the phase adjustment registers of the variable delay circuits 108, 110 and 118 are those of four bits will be explained in FIG. 3. Still more, the phase adjustment control circuit 128 has the components shown in FIG. 3 corresponding to each of the variable delay circuits 108, 110 and 118. Although a case of realizing the phase adjustment control circuit 128 by a hardware circuit will be explained in the present embodiment, the same functions may be realized by software.

The phase adjustment control circuit 128 has bit selection registers 300, 302, 304, 306 and 308, AND circuits 310, 312, 314, 316, 318, 320, 322, 324, 326, 328, 330, 332, 334, 336, 338, 340, 342 and 344, OR circuits 350, 352, 354, 356, 358 and 360 and phase adjustment registers 370, 372, 374 and 376.

The bit selection registers 300, 302, 304, 306 and 308 as well as the phase adjustment registers 370, 372, 374 and 376 hold initial set values. In concrete, the bit selection registers 300 and 302 hold "1". The bit selection registers 304, 306 and 308 hold "0". Still more, the phase adjustment register 370 holds "1". The phase adjustment registers 372, 374 and 306 hold "0".

Based on a calibration set signal, the bit selection register 300 supplies held bit data to the AND circuits 310 and 312 as well as to the bit selection register 302. Based on the calibration set signal, the bit selection register 302 supplies held bit data to the AND circuits 310, 312, 314 and 316 as well as to the bit selection register 304. Based on the calibration set signal, the bit selection register 304 supplies held bit data to the AND circuits 314, 316, 318 and 320 as well as to the bit selection register 306. Based on the calibration set signal, the bit selection register 306 supplies held bit data to the AND circuits 318, 320 and 322 as well as to the bit selection register 308. Based on the calibration set signal, the bit selection register 308 supplies held bit data to the AND circuit 322 as well as to the bit selection register 308.

The bit selection registers 300, 302, 304, 306 and 308 sequentially shift and hold the held bit data every time when the calibration set signal is supplied. That is, the bit selection registers 300, 302, 304, 306 and 308 hold "1", "1", "0", "0" and "0", respectively, in the initial setting and hold "0", "1", "1", "1" and "0", respectively, when the calibration set signal is supplied. When the calibration set signal is supplied further, they hold "0", "0", "1", "1" and "0", respectively, and the calibration set signal is still supplied, they hold "0", "0", "0", "1" and "1", respectively. The phase adjustment registers 370, 372, 374 and 376 are sequentially selected to decide set values by shifting the bit data held by the bit selection registers 300, 302, 304, 306 and 308.

The AND circuit 310 executes AND operation of the bit data supplied from the bit selection register 300 and the bit data outputted from the bit selection register 302 and supplies the operation result to the AND circuits 332 and 324. The AND circuit 312 executes AND operation of the bit data supplied from the bit selection register 300 and the bit data outputted from the bit selection register 302 and outputs the operation result to the AND circuits 334 and 350. The AND circuit 314 executes AND operation of the bit data supplied from the bit selection register 302 and the bit data outputted from the bit selection register 304 and outputs the operation result to the AND circuit 336 and the OR circuit 350. The AND circuit 316 executes AND operation of the bit data supplied from the bit selection register 302 and the bit data outputted from the bit selection register 304 and outputs the operation result to the AND circuit 338 and the OR circuit 352.

The AND circuit 318 executes AND operation of the bit data supplied from the bit selection register 304 and the bit data outputted from the bit selection register 306 and outputs the operation result to the AND circuit 340 and the OR circuit 352. The AND circuit 320 executes AND operation of the bit data supplied from the bit selection register 304 and the bit data outputted from the bit selection register 306 and outputs the operation result to the AND circuit 342 and the OR circuit 354. The AND circuit 322 executes AND operation of the bit data supplied from the bit selection register 306 and the bit data outputted from the bit selection register 308 and outputs the operation result to the AND circuit 344 and the OR circuit 354.

The OR circuit 350 executes OR operation of the output of the AND circuit 312 and the output of the AND circuit 314 and outputs the operation result to the AND circuit 326. The OR circuit 352 executes OR operation of the output of the AND circuit 316 and the output of the AND circuit 318 and outputs the operation result to the AND circuit 328. The OR circuit 354 executes OR operation of the output of the AND circuit 320 and the output of the AND circuit 322 and outputs the operation result to the AND circuit 330.

The AND circuit 324 executes AND operation of the output of the AND circuit 310 and the calibration set signal and outputs the operation result to the phase adjustment register 370. The AND circuit 326 executes AND operation of the output of the OR circuit 350 and the calibration set signal and outputs the operation result to the phase adjustment register 372. The AND circuit 328 executes AND operation of the output of the OR circuit 352 and the calibration set signal and outputs the operation result to the phase adjustment register 374. The AND circuit 330 executes AND operation of the output of the OR circuit 354 and the calibration set signal and outputs the operation result to the phase adjustment register 376. That is, When the calibration set signal is set at "1", the AND circuits 324, 326, 328 and 330 supply the clock signal to the phase adjustment registers 370, 372, 374 or 376 selected by the bit selection registers 300, 302, 304, 306 and 308.

The AND circuit 332 executes AND operation of the pass-fail signal supplied from the judging circuit 126 and the output of the AND circuit 310 and outputs the operation result to the phase adjustment register 370. Then, based on the output of the AND circuit 324, the phase adjustment register 370 outputs the held bit data and holds the output of the AND circuit 332.

The AND circuit 334 executes AND operation of the pass-fail signal supplied from the judging circuit 126 and the bit data held by the phase adjustment register 370 and outputs the operation result to the OR circuit 356. The AND circuit 336 executes AND operation of the pass-fail signal supplied from the judging circuit 126 and the output of the AND circuit 314 and outputs the operation result to the OR circuit 356. The OR circuit 356 executes OR operation of the output of the AND circuit 334 and the output of the AND circuit 336 and outputs the operation result to the phase adjustment register 372. Then, based on the output of the AND circuit 326, the phase adjustment register 372 outputs the held bit data and holds the output of the OR circuit 356.

The AND circuit 338 executes AND operation of the pass-fail signal supplied from the judging circuit 126 and the bit data held by the phase adjustment register 372 and outputs the operation result to the OR circuit 358. The AND circuit 340 executes AND operation of the pass-fail signal supplied from the judging circuit 126 and the output of the AND circuit 318 and outputs the operation result to the OR circuit 358. The OR circuit 358 executes OR operation of the output of the AND circuit 338 and the output of the AND circuit 340 and outputs the operation result to the phase adjustment register 374. Then, based on the output of the AND circuit 328, the phase adjustment register 374 outputs the held bit data and holds the output of the OR circuit 358.

The AND circuit 342 executes AND operation of the pass-fail signal supplied from the judging circuit 126 and the bit data held by the phase adjustment register 374 and outputs the operation result to the OR circuit 360. The AND circuit 344 executes AND operation of the pass-fail signal supplied from the judging circuit 126 and the output of the AND circuit 322 and outputs the operation result to the OR circuit 360. The OR circuit 360 executes OR operation of the output of the AND circuit 342 and the output of the AND circuit 344 and outputs the operation result to the phase adjustment register 376. Then, based on the output of the AND circuit 330, the phase adjustment register 376 outputs the held bit data and holds the output of the OR circuit 358.

Based on the pass-fail signal and the calibration set signal supplied from the judging circuit 126, the phase adjustment registers 370, 372, 374 and 376 hold the set value of 1 bit, respectively, in the phase adjustment stage as described above. Then, in the stage for testing the memory-under-test 150, the delay of the strobe signal effected by the variable delay circuit 108, 110 or 118 is adjusted by supplying the set value to the variable delay circuit 108, 110 or 118.

Figure 4:
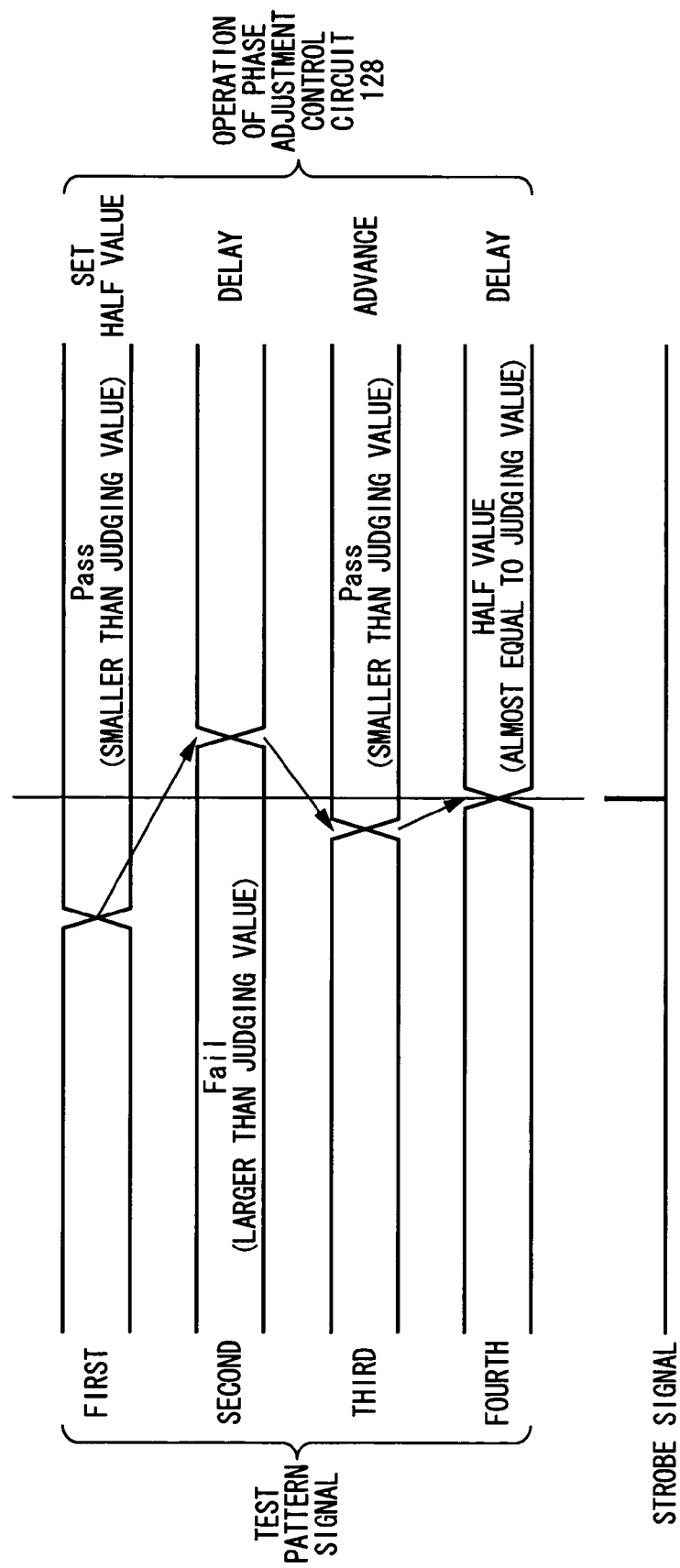
FIG. 4 is a diagram showing one exemplary operation of the phase adjustment control circuit 128.

FIG. 4 shows one exemplary operation of the phase adjustment control circuit 128 of the first embodiment. FIG. 4 explains one exemplary method for adjusting the phase of the test pattern signal by setting the delay of the variable delay circuits 108 and 110 by the judging circuit 126 shown in FIG. 2 and the phase adjustment control circuit 128 shown in FIG. 3.

At first, during when the test pattern signal of the first time is applied to the memory-under-test 150, the logical comparator 122 compares the output value with the expected value by plural times and the fail counter 124 counts the number of fail. Then, when the count value counted by the fail counter 124 is smaller than the judging value, i.e., when the pass-fail signal outputs "1" as pass data, the phase adjustment control circuit 128 delays the phase of the test pattern signal by increasing the delay of the variable delay circuits 108 and 110.

Next, during when the test pattern signal of the second time is applied to the memory-under-test 150, the logical comparator 122 compares the output value with the expected value by plural times and the fail counter 124 counts the number of fail data. Then, when the count value of the fail counter 124 is larger than the judging value, i.e., when the pass-fail signal outputs "0" as fail data, the phase adjustment control circuit 128 advances the phase of the test pattern signal by decreasing the delay of the variable delay circuits 108 and 110.

Then, during when the test pattern signal of the third time is applied to the memory-under-test 150, the logical comparator 122 compares the output value with the expected value by plural times and the fail counter 124 counts the number of fail data. When the count value of the fail counter 124 is smaller than the judging value, i.e., when the pass-fail signal outputs "1" as pass data, the phase adjustment control circuit 128 delays the phase of the test pattern signal by increasing the delay of the variable delay circuits 108 and 110.

Next, during when the test pattern signal of the fourth time is applied to the memory-under-test 150, the logical comparator 122 compares the output value with the expected value by plural times and the fail counter 124 counts the number of fail data. Then, the count value of the fail counter 124 is almost equalized with the judging value held by the judging value register 200, thus ending the phase adjustment carried out by the phase adjustment control circuit 128.

That is, according to the present embodiment, the phase adjustment control circuit 128 decides the delay effected by the variable delay circuit 108, 110 or 118 indicated by binary data by searching sequentially from the upper bit by binary search based on the judgment result outputted from the judging circuit 126. According to another embodiment, the phase adjustment control circuit 128 may search an adequate delay effected by the variable delay circuits 108, 110 and 118 by sequential search or may search an adequate delay of the variable delay circuits 108, 110 and 118 by combination of binary search and sequential search.

Figure 5:
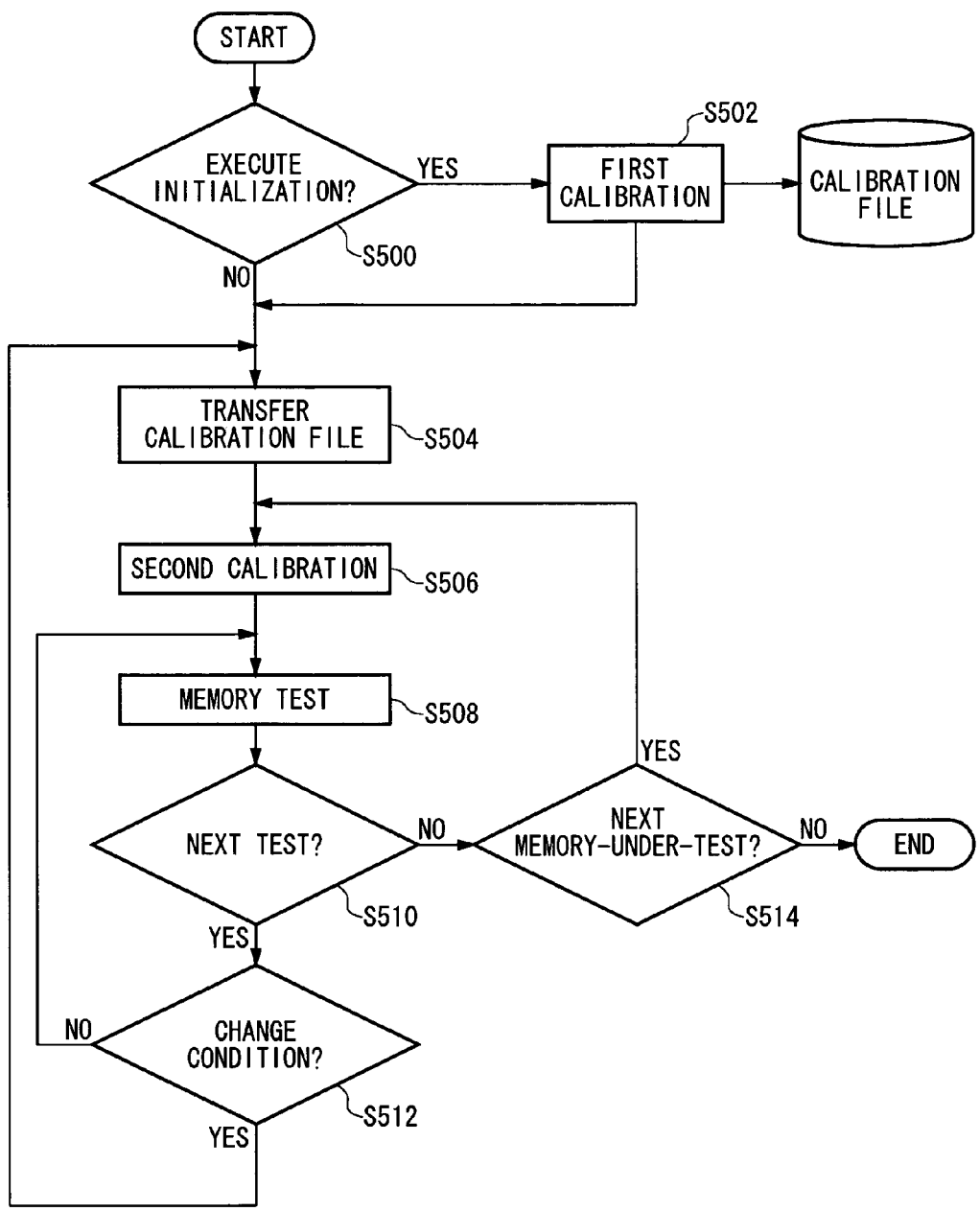
FIG. 5 is a chart showing one exemplary flow of a test method.

FIG. 5 shows one exemplary flow of the test method of the first embodiment. The phase adjustment of the present embodiment is carried out while mounting the memory-under-test 150 in a socket of the test apparatus 100. The phase adjustment is carried out for all terminals of the memory-under-test 150 through a first calibration (S502) and is carried out for terminals for high-speed data communications through a second calibration (S506).

At first, it is judged whether or not initialization for initializing the timing generator 102, a voltage-current generator, a voltage-current meter and others to predetermined conditions has been executed (S500). When the initialization has been executed (S500-y), the first calibration is carried out per test condition (S502). In order to adjust phase shift occurred in the signal to each terminal in the initialization by the variable delay circuits 108 and 110, the set values of the variable delay circuits 108 and 110 are filed and stored as calibration file in the first calibration (S502). When no initialization is carried out (S500-n), the first calibration is not carried out.

Next, the calibration file corresponding to the test condition is transferred to the phase adjustment registers of the variable delay circuits 108 and 110 (S504) to carry out second calibration (S506). In the second calibration (S506), phase adjustment is carried out only on data input/output terminals and the like which operate at high-speed among the terminals of the memory-under-test 150. When the memory-under-test 150 is an XDR-DRAM for example, only the first calibration (S502) is carried out on the terminals such as RQs 0-11, CFM/CFMN, RST, CMD, SCK, SDI and SDO and the second calibration (S506) is carried out, in addition to the first calibration (S502), on the terminals of DQ/DQNs 0-15.

When the second calibration (S506) is completed, the test of the memory-under-test 150 is executed (S508). Then, it is judged whether or not another test is executed on the same memory-under-test 150 (S510).

When the other test is executed further on the same memory-under-test 150 (S510-y), it is judged whether or not the test condition is changed (S512). When the test condition is not changed (S512-n), the test of the memory-under-test 150 is executed in succession (S508). When the test condition is changed (S512-y), the calibration file corresponding to the test condition is transferred to the phase adjustment registers of the variable delay circuits 108 and 110 (S504) to carry out the second calibration (S506).

When no other test is executed further on the same memory-under-test 150 (S510-n), it is judged whether or not a next memory-under-test 150 is to be tested (S514). When the next memory-under-test 150 is to be tested (S514-y), the second calibration is carried out (S506). Then, when the second calibration (S506) is completed, the test of the next memory-under-test is executed (S508). When no next memory-under-test 150 is to be tested (S514-n), the flow of this test ends.

Figure 6:
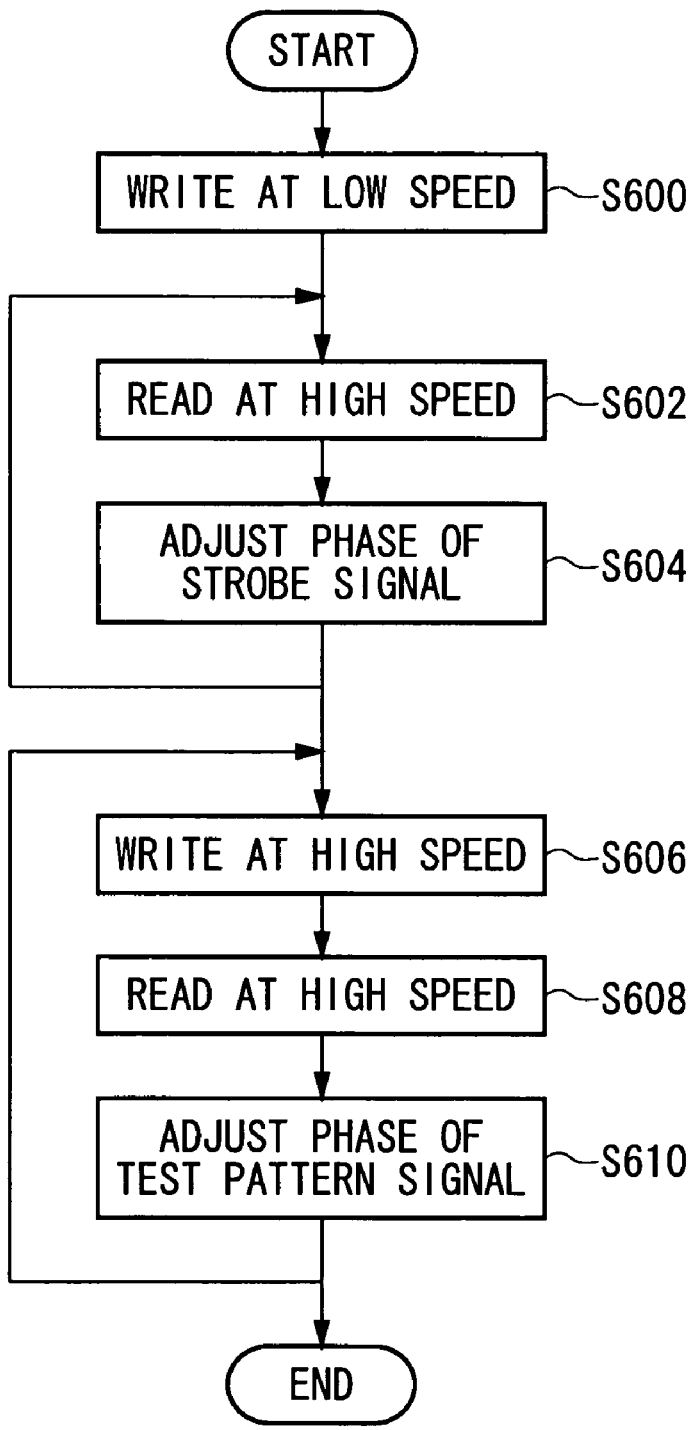
FIG. 6 is a chart showing one exemplary flow of a phase adjusting method.

FIG. 6 shows one exemplary flow of the phase adjusting method of the first embodiment. FIG. 6 explains the flow of the phase adjusting method in the second calibration (S506). At first, the test pattern signal is written into the memory-under-test 150 at low speed in a slow writing stage (S600). In the slow writing stage (S600), a test pattern signal is written from scan input/output terminals of the memory-under-test 150 via a serial bus.

Next, an output signal corresponding to the test pattern signal is read at high speed in the fast reading stage (S602). In the fast reading stage (S602), the test pattern signal is read from data input/output terminals of the memory-under-test 150.

Next, in a strobe signal phase adjusting stage (S604), the timing comparator 120 obtains the output value of the output signal read from the memory-under-test 150 in the fast reading stage (S602) with the timing of the strobe signal. The logical comparator 122 compares the output value with the expected value produced in advance and outputs the comparison result. Then, as explained in FIGS. 1 through 4, the phase adjustment control circuit 128 sets the phase adjustment register of the variable delay circuit 118 based on the comparison result of the logical comparator 122 and adjusts the timing of the strobe signal supplied to the timing comparator 120 to adjust the timing of the timing comparator 120 for sampling the output signal.

Next, in a fast writing stage (S606), the SR latch 112 rises the test pattern signal with the timing of the set signal supplied from the variable delay circuit 108 and drops the test pattern signal with the timing of the reset signal supplied from the variable delay circuit 110 to write the test pattern signal into the memory-under-test 150 at high speed. In the fast writing stage (S606), the test pattern signal is written from the data input/output terminals of the memory-under-test 150.

Next, in a fast reading stage (S608), the output signal corresponding to the test pattern signal is read out of the memory-under-test 150 at high speed. In the fast reading stage (S608), the test pattern signal is readout of the data input/output terminals of the memory-under-test 150.

Next, in a test pattern signal phase adjusting stage (S610), the timing comparator 120 obtains the output value of the output signal read out of the memory-under-test 150 in the fast reading stage (S608) with the timing of the strobe signal.

Then, the logical comparator 122 compares the output value with the expected value produced in advance and outputs the comparison result. Then, as explained in FIGS. 1 through 4, the phase adjustment control circuit 128 sets the phase adjustment registers of the variable delay circuits 108 and 110 based on the comparison result of the logical comparator 122 and adjusts the timing of the set and reset signals supplied to the SR latch 112 to adjust the timing of the test pattern signal supplied to the memory-under-test 150.

The delay of the strobe signal supplied to the timing comparator 120 may be accurately set in the strobe signal phase adjusting stage (S604) by writing the test pattern signal into the memory-under-test 150 at low speed in the slow writing stage (S600) so that the memory-under-test 150 holds the test pattern signal accurately. Still more, the delay of the set and reset signals may be accurately set in the test pattern signal phase adjusting stage (S610) by executing the test pattern signal phase adjusting stage (S610) after the strobe signal phase adjusting stage (S604).

Figure 7:
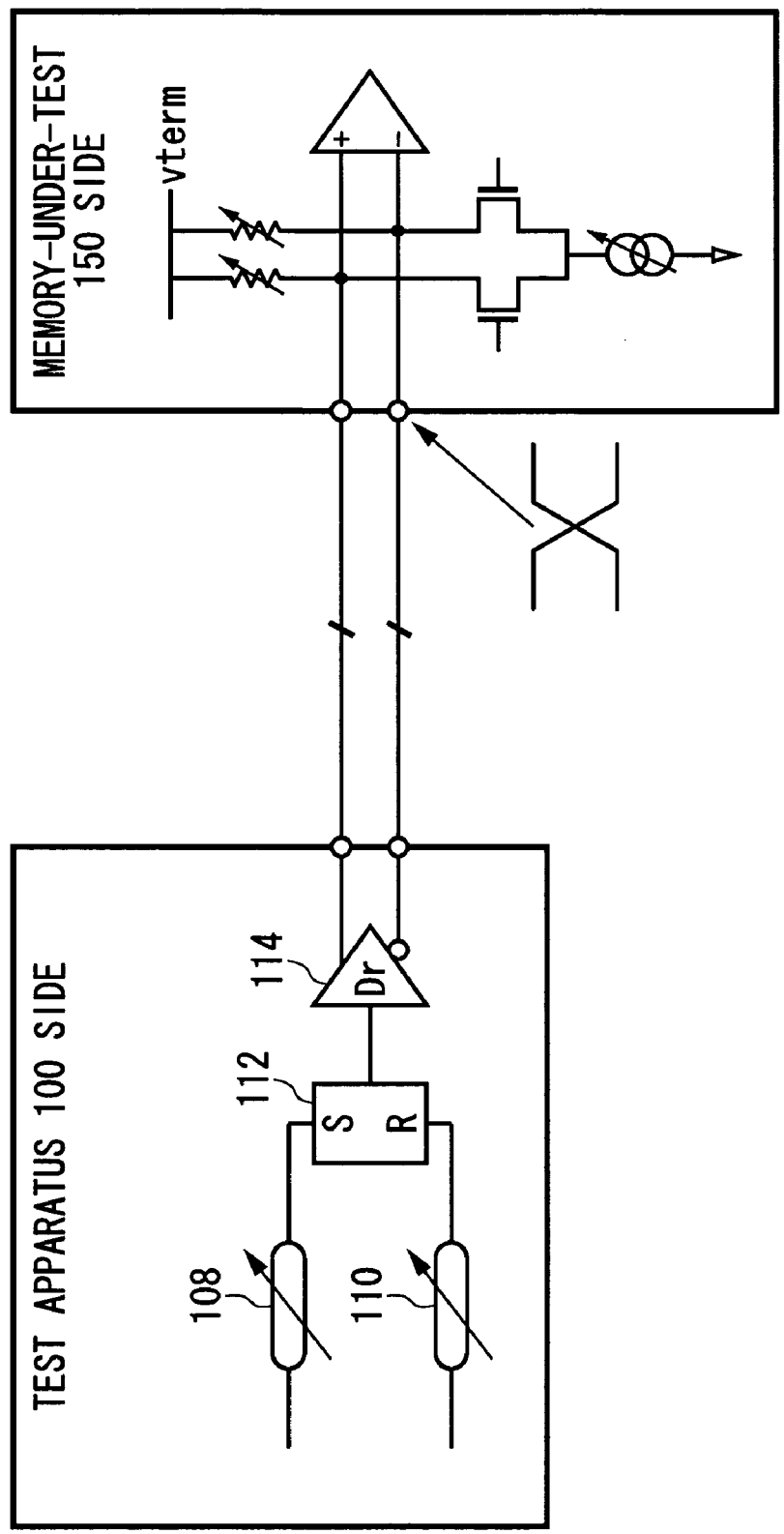
FIG. 7 is a diagram showing one example of a driver 114.
Figure 8:
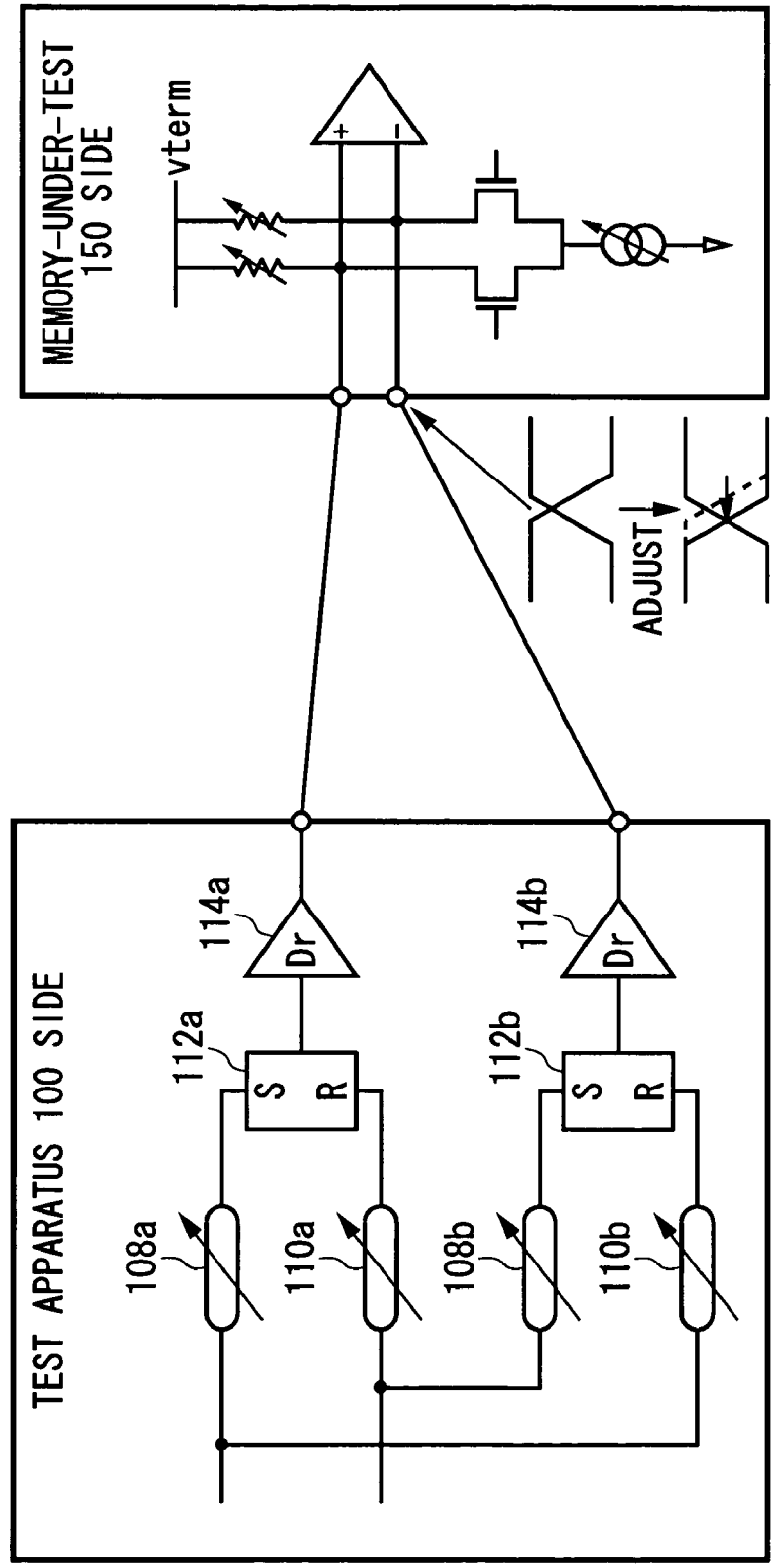
FIG. 8 is a diagram showing one example of the driver 114.
Figure 9:
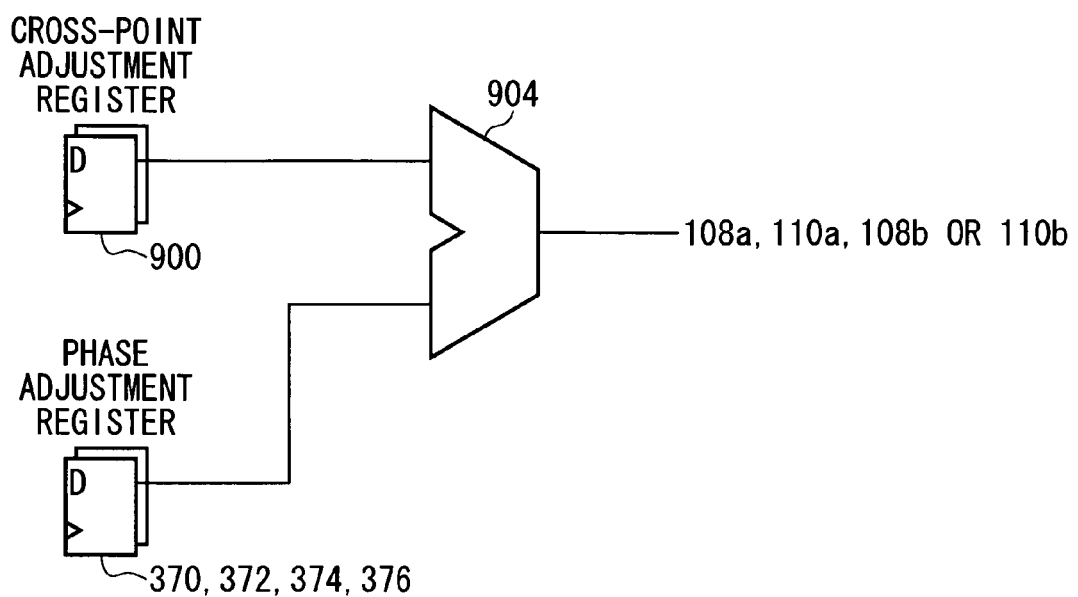
FIG. 9 is a diagram showing an exemplary variation of the configuration of a phase adjustment register.

FIGS. 7 and 8 show one example of the driver 114 of the first embodiment. FIG. 9 shows an exemplary variation of the configuration of the phase adjustment register of the first embodiment. The driver 114 is a differential driver and as shown in FIG. 7, it is presupposed that differential signals cross correctly at differential terminals of the memory-under-test 150 and that length of lines of the differential signals are equal. However, the driver is not actually configured based on such presupposition and phases of the differential signals are adjusted by using single drivers 114a and 114b as shown in FIG. 8.

That is, as shown in FIG. 8, the test apparatus 100 is provided with variable delay circuits 108a, 108b, 110a and 110b instead of the variable delay circuits 108 and 110, with SR latches 112a and 112b instead of the SR latch 112, and with the drivers 114a and 114b instead of the driver 114. The test apparatus 100 is also provided with a cross-point adjustment register 900 and an adder 904 in addition to the phase adjustment registers 370, 372, 374 and 376 as shown in FIG. 9.

The SR latch 112a rises the test pattern signal by the set signal delayed by the variable delay circuit 108a, drops the test pattern signal by the reset signal delayed by the variable delay circuit 110a and supplies the signal to the memory-under-test 150 via the driver 114a. The SR latch 112b rises the test pattern signal by the set signal delayed by the variable delay circuit 108b, drops the test pattern signal by the reset signal delayed by the variable delay circuit 110b and supplies the signal to the memory-under-test 150 via the driver 114b.

In the first calibration (S502), the adjustment is made so that the cross-point of the differential signals comes to the center of high and low levels in the differential terminals of the memory-under-test 150. Then, the adjusted set value is stored in the cross-point adjustment register 900. Next, in the second calibration (S506), the phases of the variable delay circuits 108a and 110b are adjusted in the same time and the phases of the variable delay circuits 108b and 110a are adjusted in the same time so that the cross-point does not deviate from the center. Then, the adjusted set values are stored in the phase adjustment registers 370, 372, 374 and 376. Next, the adder 904 adds the set value set in the cross-point adjustment register 900 with the set values set in the phase adjustment registers 370, 372, 374 and 376 and supplies the result to the variable delay circuit 108a, 110a, 108b or 110b. Thereby, the adjustment of the cross-point of the differential signals and the adjustment of the phase of the test pattern signal may be carried out in the same time.

Figure 10:
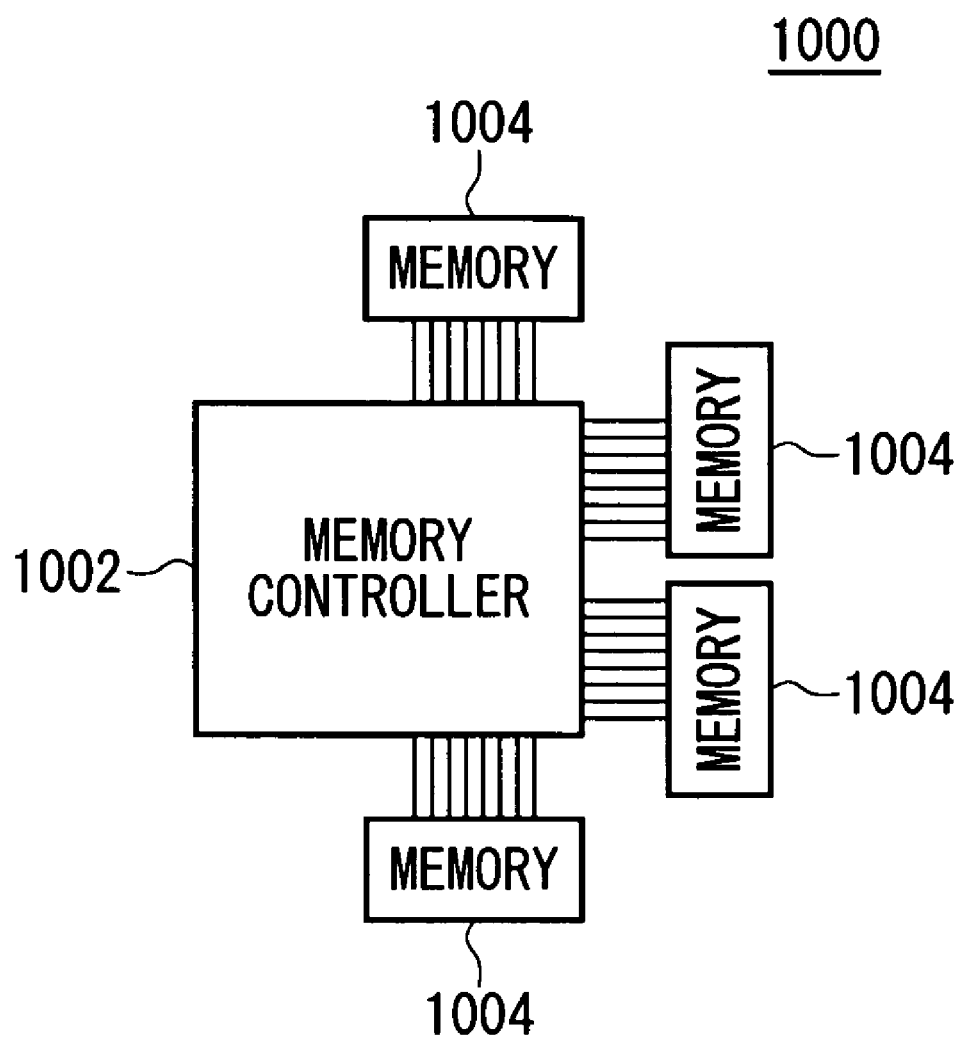
FIG. 10 is a diagram showing one exemplary configuration of a memory control system 1000.

FIG. 10 shows one exemplary configuration of a memory control system 1000 of a second embodiment. The memory control system 1000 is provided with a memory controller 1002 and a plurality of memories 1004. The memory control system 1000 forms a small amplitude (amplitude: 200 mV) signal and bilateral differential interface in signal lines for transmitting data to connect the plurality of memories 1004 with the memory controller 1002 one-to-one. Still more, a function for adjusting phase of input/output signals is built per every data input/output terminal of the memory controller 1002.

Figure 11:
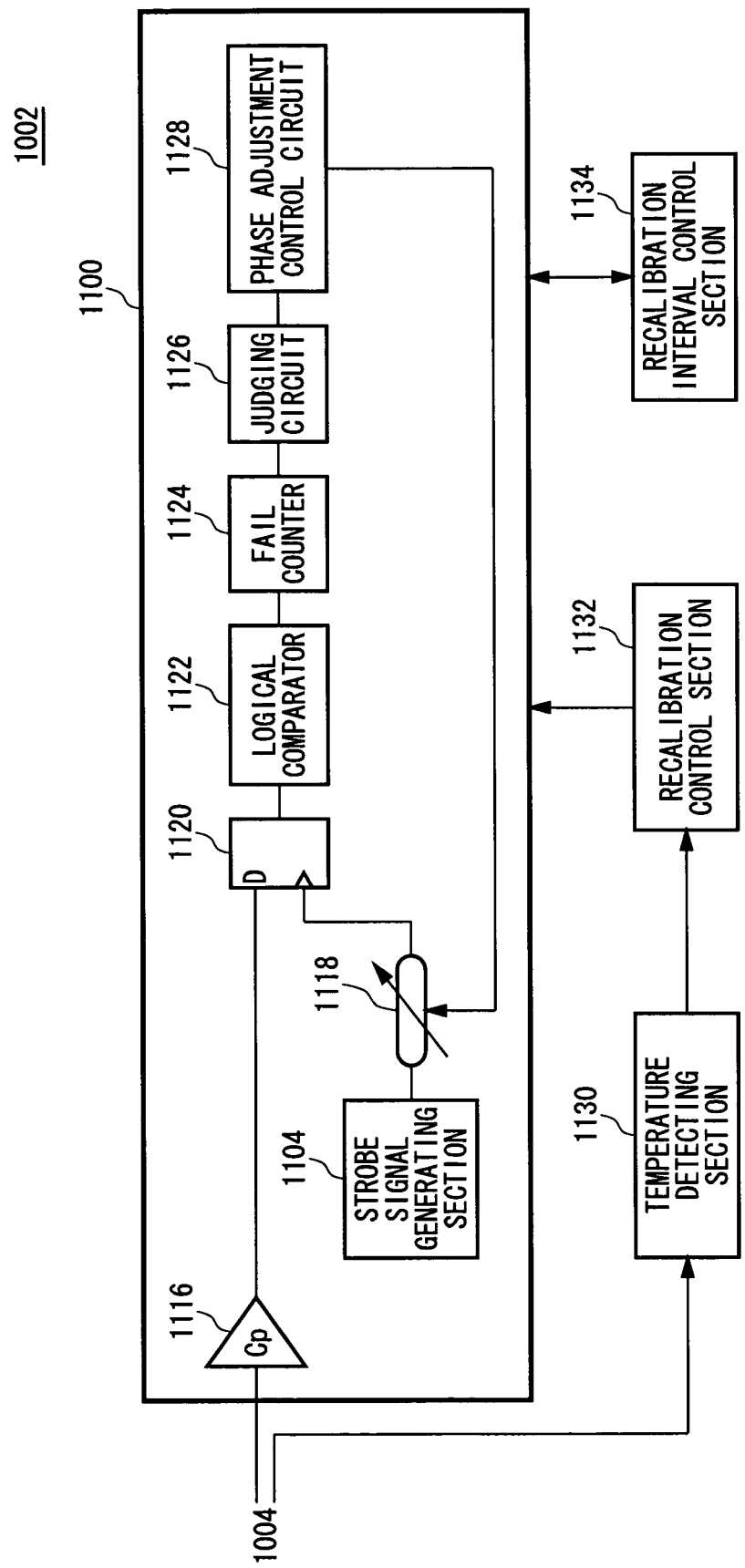
FIG. 11 is a diagram showing one exemplary configuration of a memory controller 1002.
Figure 12:
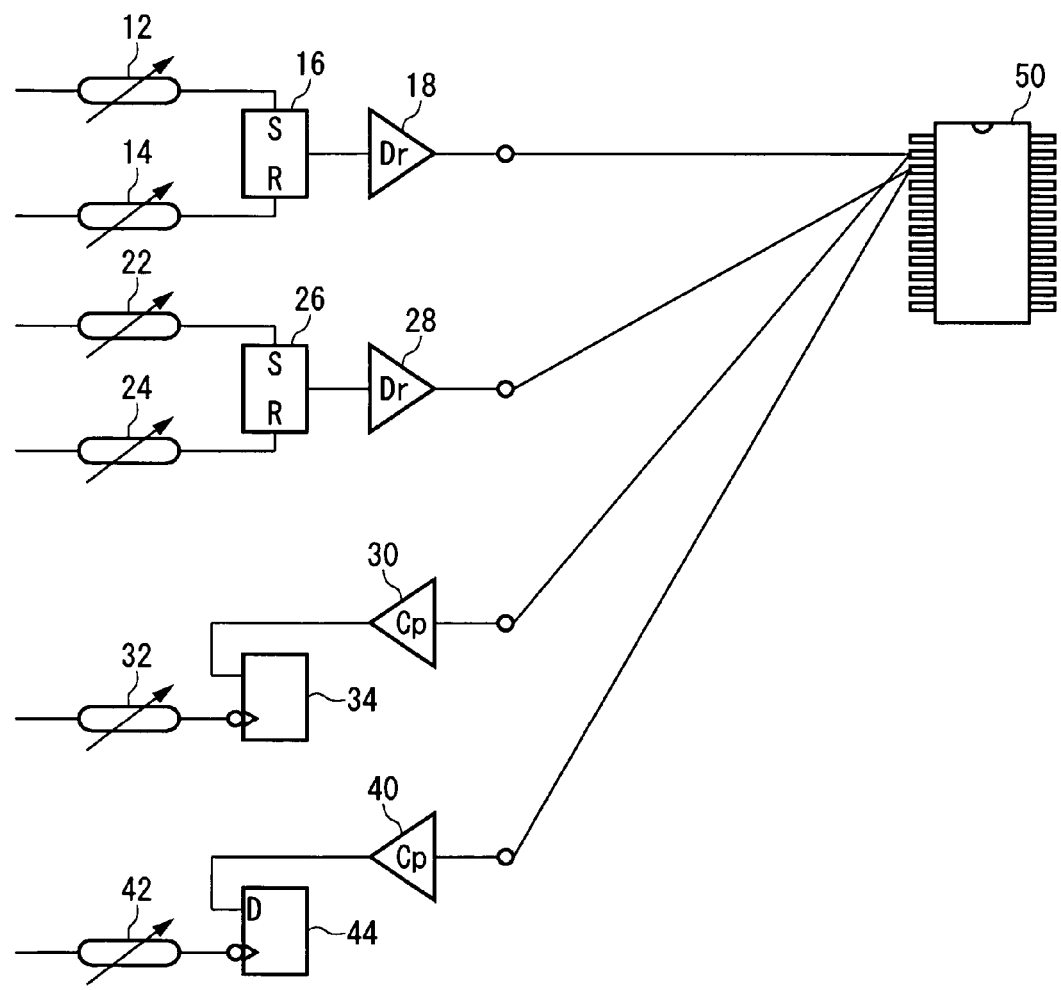
FIG. 12 is a diagram showing a configuration of a conventional test apparatus 10.

FIG. 11 shows one exemplary configuration of the memory controller 1002 of the second embodiment. The memory controller 1002 is provided with a transmission/receiving control section 1100, a temperature detecting section 1130, a re-calibration control section 1132 and a re-calibration interval control section 1134. The transmission/receiving control section 1100 has a strobe signal generator 1104, a level comparator 1116, a variable delay circuit 1118, a timing comparator 1120, a logical comparator 1122, a fail counter 1124, a judging circuit 1126 and a phase adjustment control section 1128.

The strobe signal generator 1104 generates a strobe signal for specifying timing of the timing comparator 1120 for sampling an output signal outputted from the memory-under-test 150. The variable delay circuit 1118 delays the strobe signal generated by the strobe signal generator 1104 by a delay set in advance by the phase adjustment control section 1128 and supplies the signal to the timing comparator 1120. Each of the level comparator 1116, the variable delay circuit 1118, the timing comparator 1120, the logical comparator 1122, the fail counter 1124, the judging circuit 1126 and the phase adjustment control section 1128 has the same function with each of the level comparator 116, the variable delay circuit 118, the timing comparator 120, the logical comparator 122, the fail counter 124, the judging circuit 126 and the phase adjustment control circuit 128 of the test apparatus 100 shown in FIG. 1, so that their explanation will be omitted here. The memory controller 1002 may also have the other components provided in the test apparatus 100 shown in FIG. 1.

The temperature detecting section 1130 detects changes of temperature of the memory 1004 or that around the memory 1004. When the temperature change detected by the temperature detecting section 1130 exceeds a temperature change set in advance, the re-calibration control section 1132 causes the transmission/receiving control section 1100 to adjust again the timing of the strobe signal to be supplied to the timing comparator 1120 by setting again the delay effected by the variable delay circuit 1118. That is, it enables the phase of the strobe signal to follow changes of phase of the output signal caused by the temperature change of the memory 1004. Therefore, even if the temperature increases as the memory 1004 operates, data communication between the memory 1004 and the memory controller 1002 may be made accurately.

The re-calibration interval control section 1134 measures a time interval during which the timing of the strobe signal supplied to the timing comparator 1120 should be adjusted again based on the comparison result outputted from the logical comparator 1122 per elapsed time when data is written or read continuously to/from the memory 1004. In concrete, the fail counter 1124 counts a number of fail data outputted from the logical comparator 1122 per unit time. Then, the judging circuit 1126 compares whether a judging value set in advance is larger or smaller than the count value counted by the fail counter 1124. Thereby, the re-calibration interval control section 1134 measures a time when the count value becomes larger than the judging value. That is, the re-calibration interval control section 1134 measures the time when the data communication between the memory controller 1002 and the memory 1004 cannot be made accurately due to the changes of phase of the output signal caused by the temperature change of the memory 1004 by continuously writing or reading data to/from the memory 1004. Then, the re-calibration interval control section 1134 causes the transmission/receiving control section 1100 to adjust again the timing of the strobe signal supplied to the timing comparator 1120 per each measured time interval. Thereby, even if the temperature of the memory 1004 increases as it operates, the data communication between the memory 1004 and the memory controller 1002 maybe always made accurately.

It is noted that the test apparatus 100 may further include the temperature detecting section 1130, the re-calibration control section 1132 and the re-calibration interval control section 1134 provided in the memory controller 1002 shown in FIG. 11. Still more, the timing of the strobe signal supplied to the timing comparator 120 may be adjusted following to the temperature rise of the memory-under-test 150. Still more, the time interval during which the timing of the strobe signal supplied to the timing comparator 120 should be adjusted again may be measured and be written to the memory 1004. The memory controller 1002 allows the data communication between the memory 1004 and the memory controller 1002 to be made always accurately by adjusting again the timing of the strobe signal in accordance to the time interval written by the test apparatus 100.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As it is apparent from the above description, the invention allows the memory-under-test that transmits/receives data at high speed to be tested accurately.

What is claimed is:

1. A test apparatus for testing memory-under-tests, comprising:
    a timing comparator for obtaining an output value of an output signal outputted from said memory-under-test with timing of a strobe signal;
    a logical comparator for comparing said output value obtained by said timing comparator with an expected value generated in advance and for outputting the comparison result; and
    a phase adjustment control circuit for adjusting the timing of said strobe signal based on the comparison result outputted from said logical comparator.

2. The test apparatus as set forth in claim 1, further comprising a first variable delay circuit for delaying said strobe signal and supplying the signal to said timing comparator; wherein
    said phase adjustment control circuit sets the delay effected by said first variable delay circuit based on the comparison result outputted from said logical comparator.

3. The test apparatus as set forth in claim 2, further comprising:
    a fail counter for counting a number of fail data outputted from said logical comparator as said comparison result and indicating that said output value does not coincide with said expected value; and
    a judging circuit for comparing said number of fail data counted by said fail counter with a judging value set in advance and outputting a judgment result, wherein
    said phase adjustment control circuit sets the delay effected by said first variable delay circuit based on said judgment result outputted from said judging circuit.

4. The test apparatus as set forth in claim 3, wherein said phase adjustment control circuit decides said delay effected by said first variable delay circuit and represented by binary data sequentially from the upper bit by binary search based on said judgment result outputted from said judging circuit.

5. The test apparatus as set forth in claim 1, further comprising:
    an SR latch for rising a test pattern signal with timing of a set signal and dropping said test pattern signal with timing of a reset signal and supplying said test pattern signal to said memory-under-test;
    a second variable delay circuit for delaying and supplying said set signal to said SR latch; and
    a third variable delay circuit for delaying and supplying said reset signal to said SR latch; wherein
    said timing comparator obtains the output value of the output signal outputted from said memory-under-test corresponding to said test pattern signal with timing of said strobe signal synchronized with internal clock of said memory-under-test;
    said logical comparator compares said output value obtained by said timing comparator with said expected value and outputs the comparison result; and
    said phase adjustment control circuit sets the delay effected by said second and third variable delay circuits based on said comparison result outputted from said logical comparator.

6. The test apparatus as set forth in claim 1, further comprising:
    a temperature detecting section for detecting changes of temperature of said memory-under-test or changes of temperature around said memory-under-test; and
    a re-calibration control section for adjusting again the timing of said strobe signal when the temperature change detected by said temperature detecting section exceeds a temperature change set in advance.

7. The test apparatus as set forth in claim 1, further comprising a re-calibration interval control section for measuring a time interval during which the timing of said strobe signal should be adjusted again based on said comparison result outputted from said logical comparator per elapsed time when data is written/read continuously to/from said memory-under-test.

8. A phase adjusting method for adjusting timing of an output signal outputted from a memory-under-test and a strobe signal, comprising:
   an output value obtaining step of obtaining an output value of said output signal outputted from said memory-under-test with timing of said strobe signal;
   a step of comparing said obtained output value with an expected value set in advance and outputting the comparison result; and
   a step of adjusting the timing of said strobe signal based on said comparison result.

9. The phase adjusting method as set forth in claim 8, further comprising:
   a slow writing step of writing a test pattern signal into said memory-under-test at low speed; and
   a first fast reading step of reading said output signal corresponding to said test pattern signal from said memory-under-test at high speed; wherein
   said output value obtaining step includes a step of obtaining said output value of said output signal read in said first fast reading step with the timing of said strobe signal.

10. The phase adjusting method as set forth in claim 9, wherein said slow writing step includes a step of writing said test pattern signal via scan input/output terminals of said memory-under-test; and
   said first fast reading step includes a step of reading said test pattern signal out of data input/output terminals of said memory-under-test.

11. The phase adjusting method as set forth in claim 8, comprising:
   a fast writing step of rising a test pattern signal with timing of a set signal, of dropping said test pattern signal with timing of a reset signal and writing said test pattern signal to said memory-under-test at high speed;
   a second fast reading step of reading said output signal corresponding to said test pattern signal out of said memory-under-test at high speed;
   a step of obtaining the output value of said output signal read out in said second fast reading step with the timing of said strobe signal;
   a step of comparing said obtained output value with said expected value set in advance and of outputting the comparison result; and
   a step of adjusting the timing of said set and reset signals based on said comparison result.

12. The phase adjusting method as set forth in claim 11, wherein said fast writing step includes a step of writing said test pattern signal from the data input/output terminals of said memory-under-test; and
   said second fast reading step includes a step of reading said test pattern signal from the data input/output terminals of said memory-under-test.

13. A memory controller for controlling data writing and reading operations of a memory, comprising:
   a timing comparator for obtaining an output value of an output signal read out of said memory with timing of a strobe signal;
   a logical comparator for comparing said output value obtained by said timing comparator with an expected value set in advance and for outputting a comparison result;
   a phase adjustment control circuit for adjusting the timing of said strobe signal based on said comparison result outputted from said logical comparator;
   a temperature detecting section for detecting temperature of said memory or changes of temperature around said memory; and
   a re-calibration control section for adjusting again the timing of said strobe signal when the temperature change detected by said temperature detecting section exceeds a temperature change set in advance.

14. A memory controller for controlling data writing and reading operations of a memory, comprising:
   a timing comparator for obtaining an output value of an output signal read out of said memory with timing of a strobe signal;
   a logical comparator for comparing said output value obtained by said timing comparator with an expected value set in advance and for outputting a comparison result;
   a phase adjustment control circuit for adjusting the timing of said strobe signal based on said comparison result outputted from said logical comparator; and
   a re-calibration interval control section for measuring a time interval during which the timing of said strobe signal should be adjusted again based on said comparison result outputted from said logical comparator per elapsed time when data is written or read continuously to/from said memory.

* * * * *